United States Patent
Sanguinetti (10) Patent No.: US 6,404,358 B1
(45) Date of Patent: Jun. 11, 2002

(54) DECODING METHOD FOR A HUFFMAN CODE

(75) Inventor: Davide Sanguinetti, Genoa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 70 days.

(21) Appl. No.: 09/594,245

(22) Filed: Jun. 15, 2000

(51) Int. Cl.$^7$ ................................................ H03M 7/40

(52) U.S. Cl. ............................ 341/65; 341/79; 340/347

(58) Field of Search ........................... 341/65, 67, 106, 341/79, 95, 86, 87, 76, 78; 340/347

(56) References Cited

U.S. PATENT DOCUMENTS

| | | | |
|---|---|---|---|
| 4,475,174 A | | 10/1984 | Kanayama .................. 364/900 |
| 5,216,423 A | * | 6/1993 | Mukherjee .................... 341/79 |
| 5,801,648 A | * | 9/1998 | Satoh et al. .................... 341/50 |
| 5,973,626 A | * | 10/1999 | Berger et al. .................. 341/65 |
| 6,300,888 B1 | * | 10/2001 | Chen et al. .................... 341/63 |

FOREIGN PATENT DOCUMENTS

| | | | |
|---|---|---|---|
| EP | 0593046 | 10/1993 | ............ H03M/7/40 |
| EP | 0683569 | 5/1995 | ............ H03M/7/42 |

OTHER PUBLICATIONS

Cain, R.G. "Unified Encoding and Decoding of Huffman Codes" IBM Technical Disclosure Bulletin. vol. 16, No. 11, Document No. XP–002126809, Apr. 1974, pp. 3678–3681.

\* cited by examiner

*Primary Examiner*—Brian Young
*Assistant Examiner*—John Nguyen
(74) *Attorney, Agent, or Firm*—Lisa K. Jorgenson; Allen, Dyer, Doppelt, Milbrath & Gilchrist, P.A.

(57) ABSTRACT

A decoding method for a Huffman code includes receiving a continuous stream of coded data each including a variable number of bits at least equal to a minimum number, and obtaining from each item of coded data a corresponding item of source data. The method includes providing a decoding memory structure comprising, for each value of an initial group of bits including a number not greater than the minimum number and for each value of each further bit, a record formed by a flag having an end-of-decoding value or a not end-of-decoding value and a field indicating the source data or the records associated with the values of an immediately following bit depending on whether the flag has, respectively, the end value or the not end value. The record corresponding to the value of the initial group is accessed. The method further includes repeating, until a record having the flag with the end value is reached, accessing the record corresponding to the value of the immediately following bit by the field of the current record. The source data is obtained from the field of the current record.

28 Claims, 6 Drawing Sheets

DECODING METHOD FOR A HUFFMAN CODE

FIELD OF THE INVENTION

The present invention relates to decoding, and, more particularly, to a decoding method and apparatus for a Huffman code.

BACKGROUND OF THE INVENTION

Huffman codes are commonly used in various applications such as, for example, in compression/decompression algorithms for digital, audio or video signals. In a Huffman code, each item of source data (symbol) is coded by a variable number of bits which is inversely proportional to a statistical frequency of use of the source data. The coded data is generally supplied by a continuous stream of bits without any separator element (control element) so as to increase the level of compression.

The source data is obtained from the corresponding coded data using special decoding tables. In particular, a look-up table (LUT) is used in which each row contains a flag indicating whether an index for access to the row represents an item of coded data. If this is the case, the row contains a field which specifies the associated source data. The bits of the coded data received in sequence are used to form the index of the decoding table, until a row, the flag of which indicates an item of coded data, is reached. The corresponding source data is obtained from this row.

If Max indicates the maximum number of bits of the coded data, the decoding table must therefore have a number of rows substantially equal to $2^{Max}$. This involves an extremely large amount of memory, in particular, in the case where there are several alternative decoding tables, which are selected according to the various statistical distribution of the source data.

Another known decoding method groups together the possible values of the coded data in clusters, each including a number of bits ranging between two consecutive multiples of a predefined value. Each cluster has associated with it, for each value of the maximum number of bits added to the preceding cluster, a row of the decoding table which contains a coded data flag. If the flag indicates an item of coded data, the row contains two fields which specify the associated source data and its length. In the opposite case, the two fields specify an address of the next cluster and its maximum length.

The maximum number of bits of the first cluster is used to access a row of the decoding table. The decoding method repeats—until it reaches a row, the flag of which indicates an item of coded data—the steps for selecting the bits of the next cluster (the number of which is obtained from the current row) and accessing the row corresponding to their value (using the address obtained from the current row). The source data and its actual length are obtained from the fields of the row thus obtained. In this way, it is possible to reduce substantially the amount of memory occupied by the decoding table.

A drawback of the known approach described above is that the decoding method requires a lot of feedback cycles. This makes the decoding method somewhat complex and slow. Moreover, the amount of memory occupied by the decoding table is, in any case, not insignificant.

SUMMARY OF THE INVENTION

An object of the present invention is to overcome the abovementioned drawbacks. This and other objects, features and advantages are provided by a decoding method for a Huffman code, comprising the steps of receiving a continuous stream of coded data each including a variable number of bits at least equal to a minimum number, and obtaining from each item of coded data a corresponding item of source data. A decoding memory structure is provided which comprises, for each value of an initial group of bits comprising a number not greater than the minimum number and for each value of each further bit, a record formed by a flag having an end-of-decoding value or a not end-of-decoding value and a field indicating the source data or the records associated with the values of an immediately following bit depending on whether the flag has, respectively, the end value or the not end value.

The method further includes accessing the record corresponding to the value of the initial group, and repeating—until a record having the flag with the end value is reached—the step of accessing the record corresponding to the value of the immediately following bit using the field of the current record. The source data is obtained from the field of the current record.

Moreover, a corresponding processor program, program product and processing system are provided for decoding a Huffman code.

BRIEF DESCRIPTION OF THE DRAWINGS

Further characteristic features and advantages of the decoding method according to the present invention will emerge from the description, provided below, of a preferred embodiment thereof, provided by way of a non-limiting example, with reference to the accompanying figures, in which.

DETAILED DESCRIPTION OF THE PREFERRED EMBODIMENTS

Figure 1:
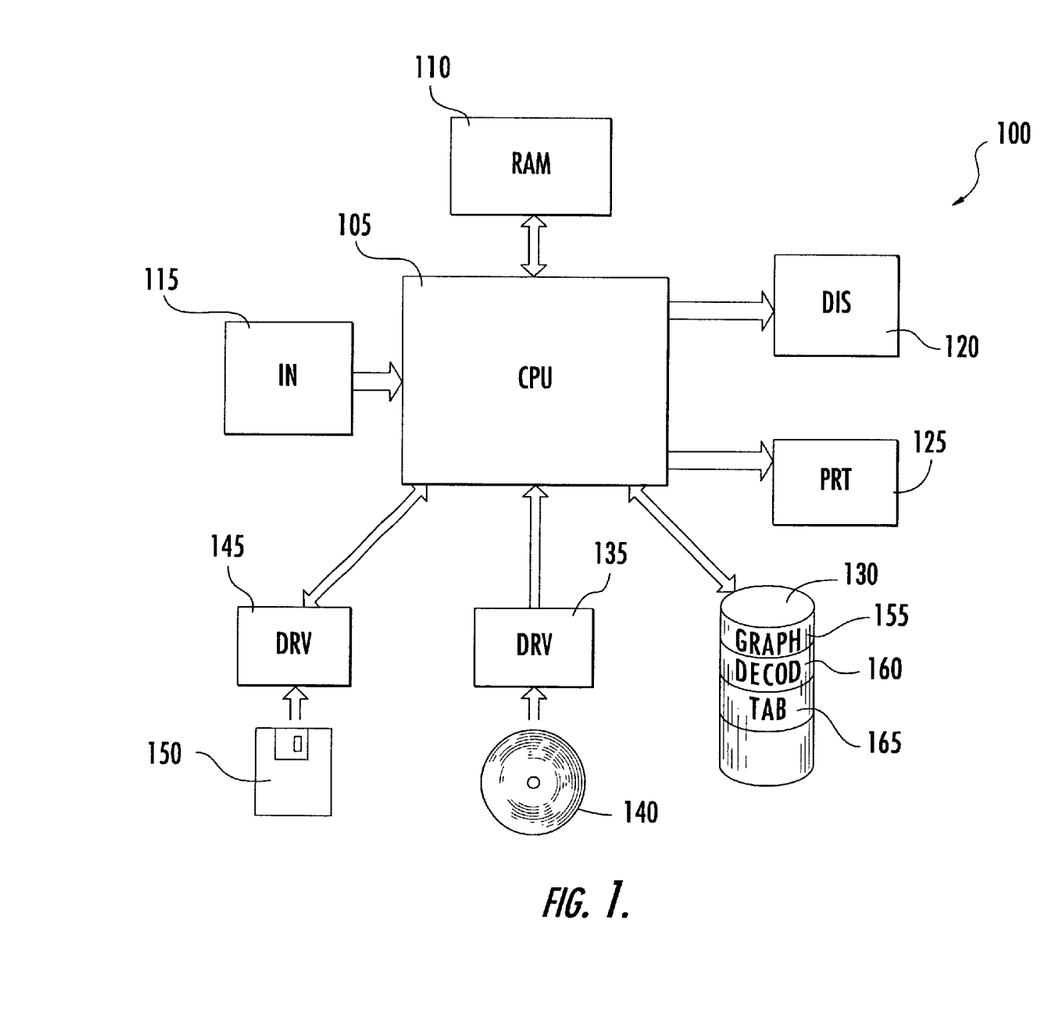
FIG. 1 is a processing system in which the decoding method of the present invention may be used.

With reference in particular to FIG. 1, a processing system 100 comprising a workstation used for graphic applications is shown. The workstation 100 includes a central processing unit (CPU) 105 with which a working memory 110, which is typically a random access memory (RAM). The CPU 105 is connected in a conventional manner to an input unit (IN) 115, to an output unit comprising a display (DIS) 120, and a printer (PRT) 125. An example input unit (IN) 115 is a keyboard, with the addition, if required, of a pointing device, such as a mouse. The display (DIS) 120 may include a monitor, for example. The CPU 105 is also connected to a mass memory comprising a magnetic hard disk 130, a driver device (DRV) 135 for reading optical disks (CD-ROM) 140, and a driver device 145 for reading/writing floppy disks 150.

The hard disk 130 has, stored on it, a graphics application (GRAPH) 155 for processing digital images. Each digital image comprises a matrix of source data, each representing a basic image area (pixel). The digital image is stored in compressed form on the CD-ROM 140 which is inserted into the driver 135. In particular, each item of source data is coded via the Huffman code using a compression algorithm, such as JPEG.

When the graphics application 155 is running on the workstation 100, the compressed digital images are loaded from the CD-ROM 140 into the working memory 110. The digital images are decompressed, obtaining the corresponding source data for each item of coded data so that it may be displayed on the monitor 120, and, if necessary, modified. For this purpose a decoding program 160 which uses a decoding table 165 as described in detail below is planned. The decoding program 160 and the decoding table 165 are stored on the hard disk 130 and are loaded into the working memory 110 when the program is run.

Similar considerations are applicable in the case where the workstation has a different structure. The structure may be, for example, provided with a board for connection to a network, or a different compression algorithm, such as an MPEG algorithm. The decoding method according to the present invention is also suitable for use in a digital camera, in a digital motion picture camera, or in a hi-fi system in which the data represents audio signals coded using a Digital Theater System (DTS) algorithm, for example, or in any other processing system.

Typically, the decoding program 160 and the decoding table 165 are supplied on floppy disks so that they may be installed on the hard disk 130. Alternatively, the decoding program is supplied on a CD-ROM, is pre-loaded onto the hard disk, or is stored on any other medium which can be read by a processor. The decoding program may also be sent via the network to the workstation (e.g., via the Internet), broadcast or, more generally, is supplied in any other form which can be directly loaded into the working memory of the processor. The decoding method according to the present invention may, however, also be implemented using a physical structure (hardware), for example, in integrated form in a chip made of semiconductor material.

Let us now consider an example of a Huffman code defined by the following table, in which, for each value of the coded data, the corresponding source data is indicated in decimal form for the sake of simplicity of the description:

| Coded data | Source data |
| --- | --- |
| 00 | 1 |
| 10 | 2 |
| 11 | 3 |
| 010 | 4 |
| 0111 | 5 |
| 01100 | 6 |
| 01101 | 7 |

Each item of coded data comprises a variable number of bits (maximum of 5). The number of bits is equal to or greater than a minimum number Min, which is equal to 2 in the example.

Figure 2A:
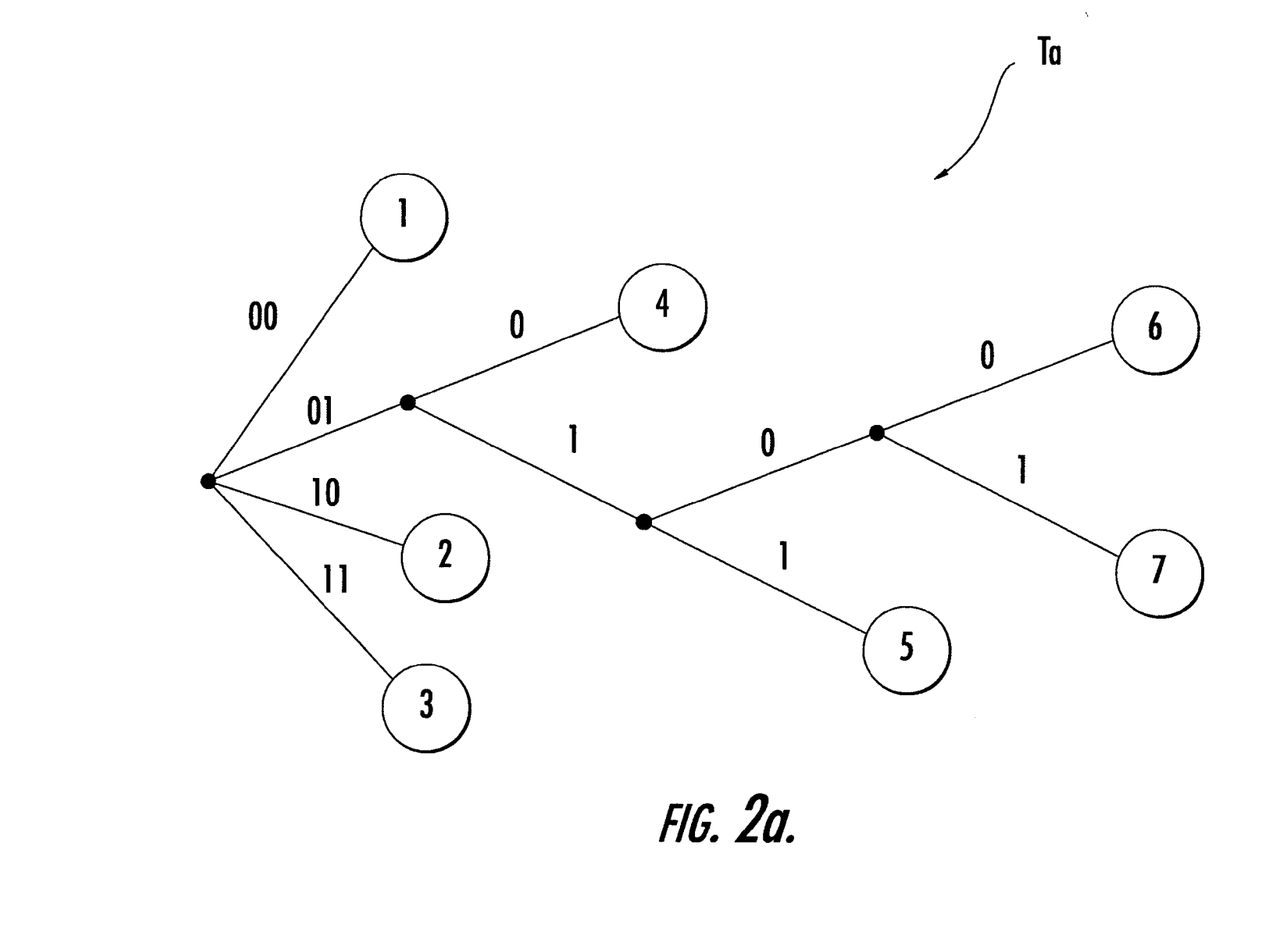
FIGS. 2a and 2b show, respectively, a tree representing a Huffman code and the corresponding contents of a working memory of the processing system in accordance with the present invention.

The Huffman code may be represented, as shown in FIG. 2a, by a tree Ta. The initial node (root) of the tree Ta is associated with an initial group of bits of the coded data comprising a number equal to the minimum number Min. The minimum number Min comprises the first two bits of the coded data in the example. From the root $2^{Min}$ branches extend therefrom, each being associated with a different value of the initial group (00, 01, 10 and 11). The intermediate nodes of the tree Ta are associated with the additional bits of the coded data. Two branches extend from each intermediate node, each being associated with a different value of the bit (0 and 1). The terminal nodes (leaves) of the tree Ta represent the corresponding source data.

Figure 2B:
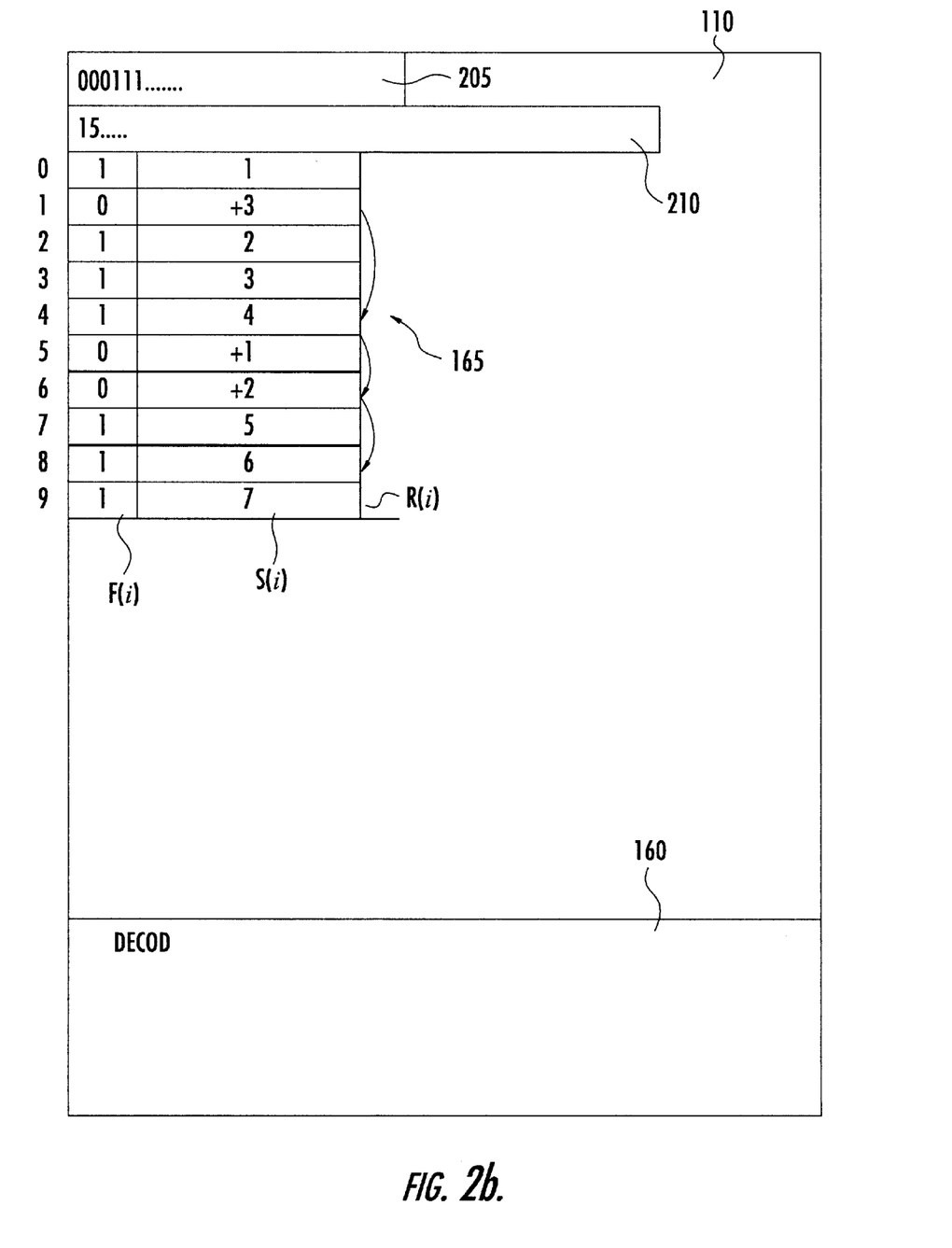

With reference to FIG. 2b, a part of the contents of the working memory 110 during running of the decoding program 160 is shown. A memory area 205 is used for storing the coded data. The coded data loaded from the CD-ROM, for example, are supplied with a continuous stream of bits without any control element. A further memory area 210 is used for storing the corresponding source data.

The decoding table 165 is also loaded from the hard disk, for example, into the working memory 110. The decoding table 165 comprises a plurality of rows R(i), where i=0 . . . 9 in the example. A row R(i) of the decoding table 165 is associated with each value of the initial group and each value of each additional bit of the coded data. In particular, the rows 0–3 represent the $2^{min}$ branches which extend from the root of the tree, with the rows 0, 1, 2 and 3 being associated, respectively, with the values 00, 01, 10 and 11 of the initial group. The two branches which extend from each intermediate node of the tree are represented by two adjacent rows (rows 4–5, 6–7 and 8–9), with the first row (4, 6 and 8) being associated with the value 0 of the bit and with the second row (5, 7 and 9) being associated with the value 1 of the bit.

Each row R(i) comprises a flag F(i) and a field S(i). The flag F(i) has an end-of-decoding value, for example 1, which indicates that a leaf of the tree has been reached, or a not end-of-decoding value, for example 0, which indicates that an intermediate node of the tree has been reached. If the flag F(i) has the end-of-decoding value (1), the field S(i) contains the corresponding source data. If the flag F(i) has the not end-of-decoding value (0), the field S(i) contains a pointer at the first line associated with the immediately following bit, i.e., following the initial group or the current bit. In particular, the pointer comprises an off-set of the first row associated with the immediately following bit with respect to the current row. Similar considerations apply in the case where the flag has a different value, the source data is obtained from the contents of the field with the addition of an off-set, or another equivalent memory structure is used, such as a list of recorded data linked to each other by dynamic pointers, for example.

Figure 3:
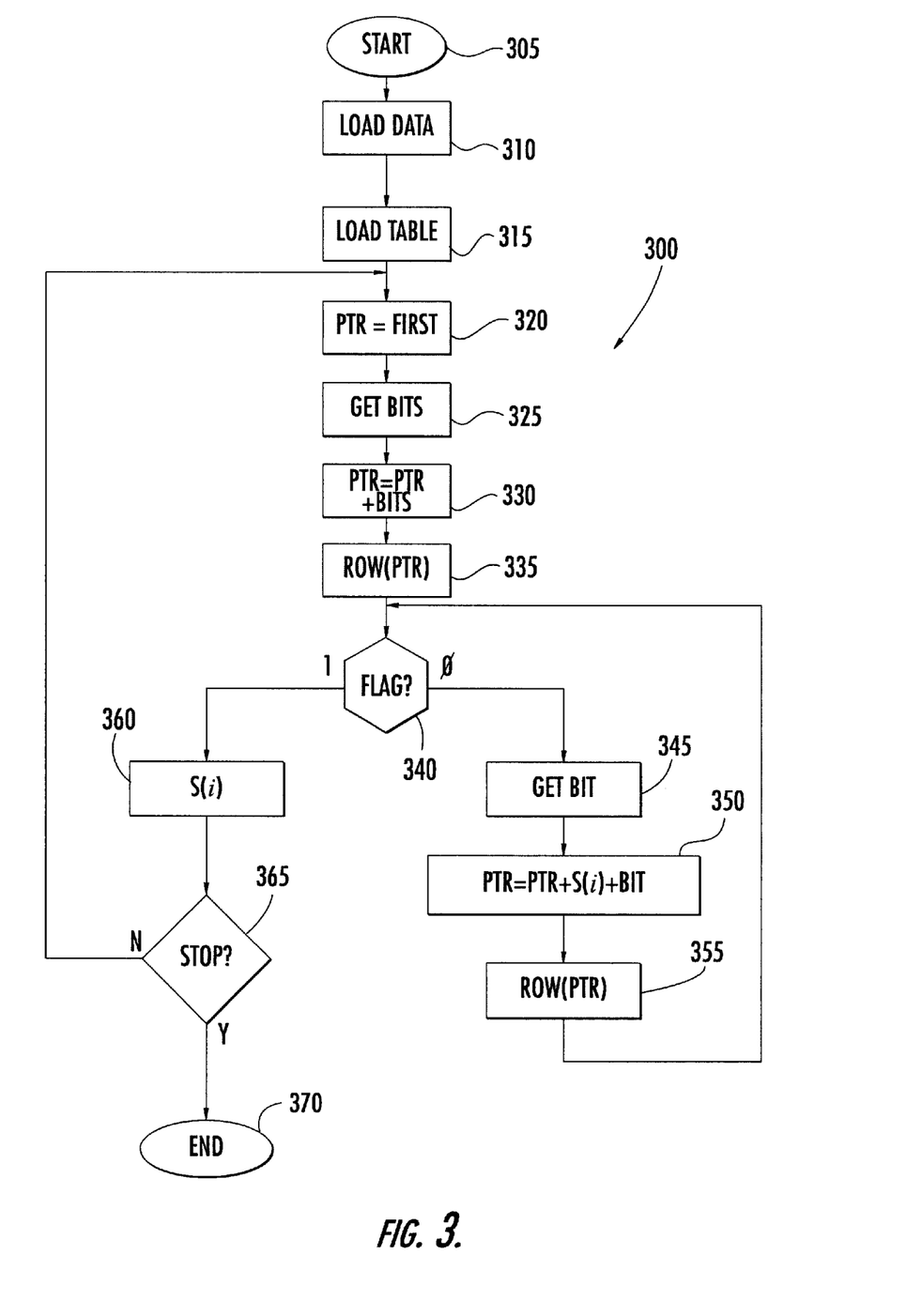
FIG. 3 is a flow diagram of the decoding method in accordance with the present invention.

If we now consider FIG. 2b and FIG. 3 in combination, the decoding program, when it is run on the workstation, implements a method 300 which starts at the step 305 and then passes to the step 310 where the coded data is loaded into the memory area 205. The method then passes to the step 315 where the decoding table 165 is loaded into the working memory 110.

With reference to the step 320, a pointer at the current node PTR is set to an initial value equal to the index of the first line of the table 165 (PTR=0). Passing on to the step 325, the method then reads, from the memory area 205, a number of bits which is equal to the minimum number Min, which forms the initial group of the coded data. With reference to the step 330, the current pointer PTR is incremented by the value of the initial group. The row of the table 165 addressed by the current pointer PTR is read at the step 335.

The method then repeats a cycle which starts at the step 340 where the value of the flag F(i) is verified. If the flag F(i) has the not end-of-decoding value (0), the method passes to the step 345, in which the immediately following bit is read from the memory area 205. Considering the step 350, the current pointer PTR is incremented by the off-set of the field S(i) of the current row and the value of the bit read. The row of the table 165 addressed by the current pointer PTR is read at the step 355. The method then returns to the step 340 to verify the condition for exiting from the cycle 340–355.

If, at the step 340, the flag F(i) has the end-of-decoding value (1), the method passes to the step 360 where the source data is obtained from the field S(i) of the current row and is stored in the memory area 210. The method then verifies at the step 365 whether the end of the coded data has been reached. If it has not been reached, the method returns to the step 320 in order to repeat the steps described above, whereas, if the end has been reached, the method terminates at the final step 370.

Let us now consider, for example, the stream of coded data bits shown in FIG. 2b (00011 . . . ). The method reads the bits of the first initial group 00 and increments the current pointer PTR, which is initially zero (PTR=0+0=0). The pointer PTR addresses the row 0 of the table 165. The flag F(0) has the end-of-decoding value 1, so that the field S(0) contains the corresponding source data (1), which is stored in the memory area 210. The pointer PTR is set again to the zero initial value. The method reads the bits of the next initial group 01 and increments the current pointer (PTR=0+1=1). The flag F(1) has the not end-of-decoding value 0, so that the method reads the next bit 1 and increments the pointer PTR of the off-set of the field S(1) and the value of this bit (PTR=1+3+1=5). The flag F(5) has the not end-of-decoding value 0, so that the method reads the next bit 1 and increments the pointer PTR of the off-set of the field S(5) and the value of this bit (PTR=5+1+1=7). The flag F(7) has the end-of-decoding value 1, so that the field S(7) contains the corresponding source data (5) which is stored in the memory area 210, and so on.

Similar considerations apply in the case where the decoding method is performed using other equivalent steps. The Huffman code has a different minimum number and maximum number of bits, down to the minimum number equal to 1. The initial group comprises any number of bits, in any case, not greater than the minimum number Min (down to a single bit), and the like.

The method in accordance with the present invention is relatively straightforward and effective. Moreover, this decoding method allows the amount of memory occupied by the decoding table to be reduced. This allows, for example, the decoding table to be loaded into a memory of the cache type inside the CPU, thus greatly speeding up every operation involving access thereto.

In the preferred embodiment of the present invention described above, the initial group comprises a number of bits which is equal to the minimum number Min (where Min>1). This results in a faster decoding speed in that all the bits of the initial group are considered with a single cycle. Moreover, this characteristic further reduces the amount of memory occupied by the decoding table.

In fact, in the case where each bit of coded data is represented by a node, the tree is of the binary type (i.e., two branches which extend from each node) and comprises N1-1 nodes, with N1 equal to the number of source data (levels). Therefore, the decoding table includes (N1-1)*2 rows. In the case where an initial group comprises a number of bits equal to the minimum number Min, the rows associated with the root are $2^{Min}$. These rows replace the first $(2^{Min}-1)*2$ rows of the corresponding binary tree so that the result is that the decoding table includes $(N1-1)*2-(2^{Min}-1)*2+2^{Min}=(N1-1)*2-(2^{Min}-2)$ rows. This allows a further reduction in the amount of memory occupied, on the order of 10%, to be achieved.

Figure 4A:
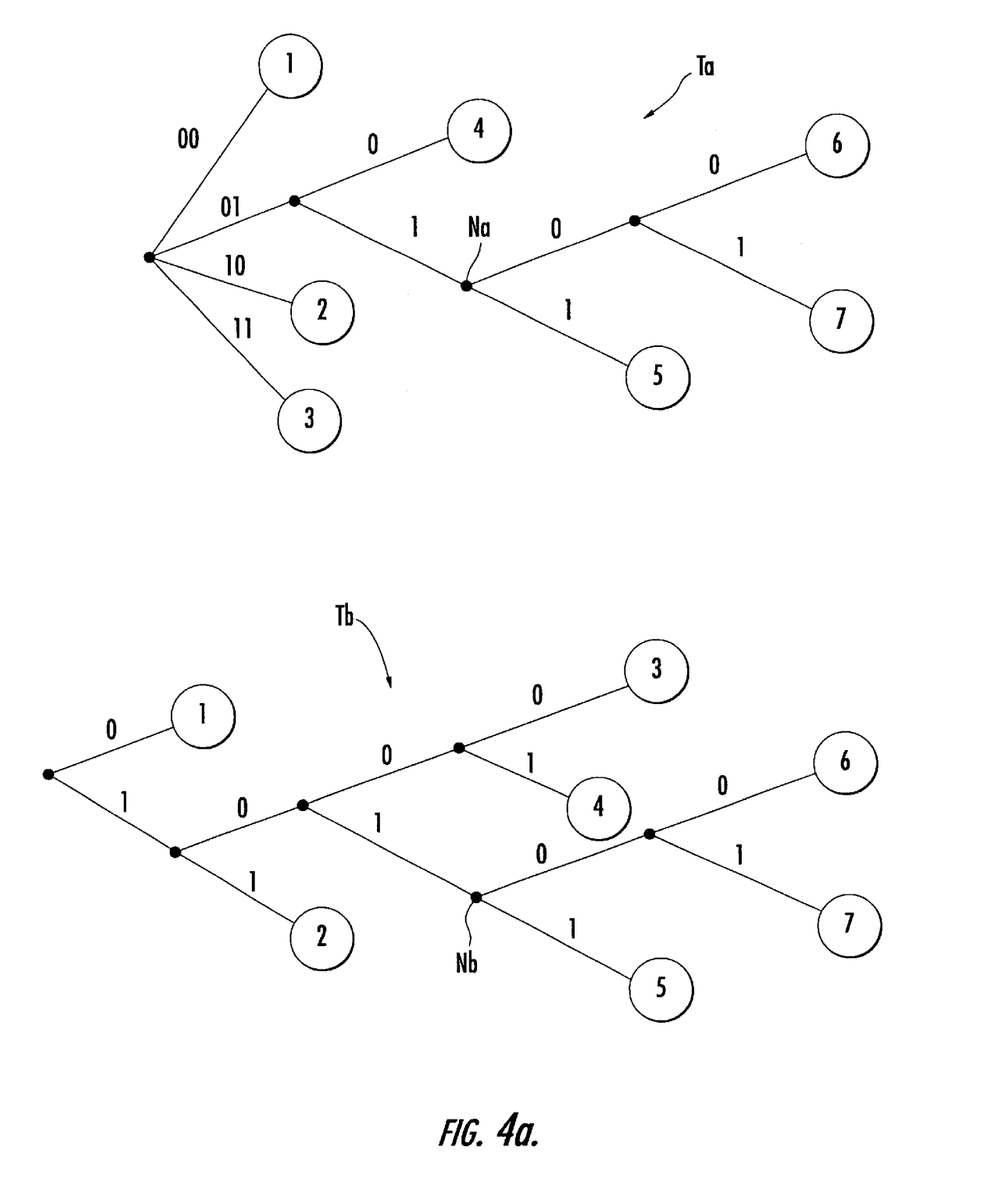
FIGS. 4a and 4b show the trees and the contents of the working memory for different Huffman codes in accordance with the present invention.

With reference now to FIG. 4a, this illustrates a situation in which two different Huffman codes are planed. The first Huffman code is represented by the tree Ta, whereas the second Huffman code is represented by a further tree Tb. The sub-tree which extends from the node Na of the tree Ta (in which each leaf is also a leaf of the tree Ta and not an intermediate node thereof) is equal to the sub-tree which extends from the node Nb of the tree Tb. A corresponding decoding table is associated with each tree Ta and Tb. These decoding tables have a common portion, which is associated with the sub-tree which extends from the node Na of the tree Ta and with the sub-tree which extends from the node Nb of the tree Tb.

Figure 4B:
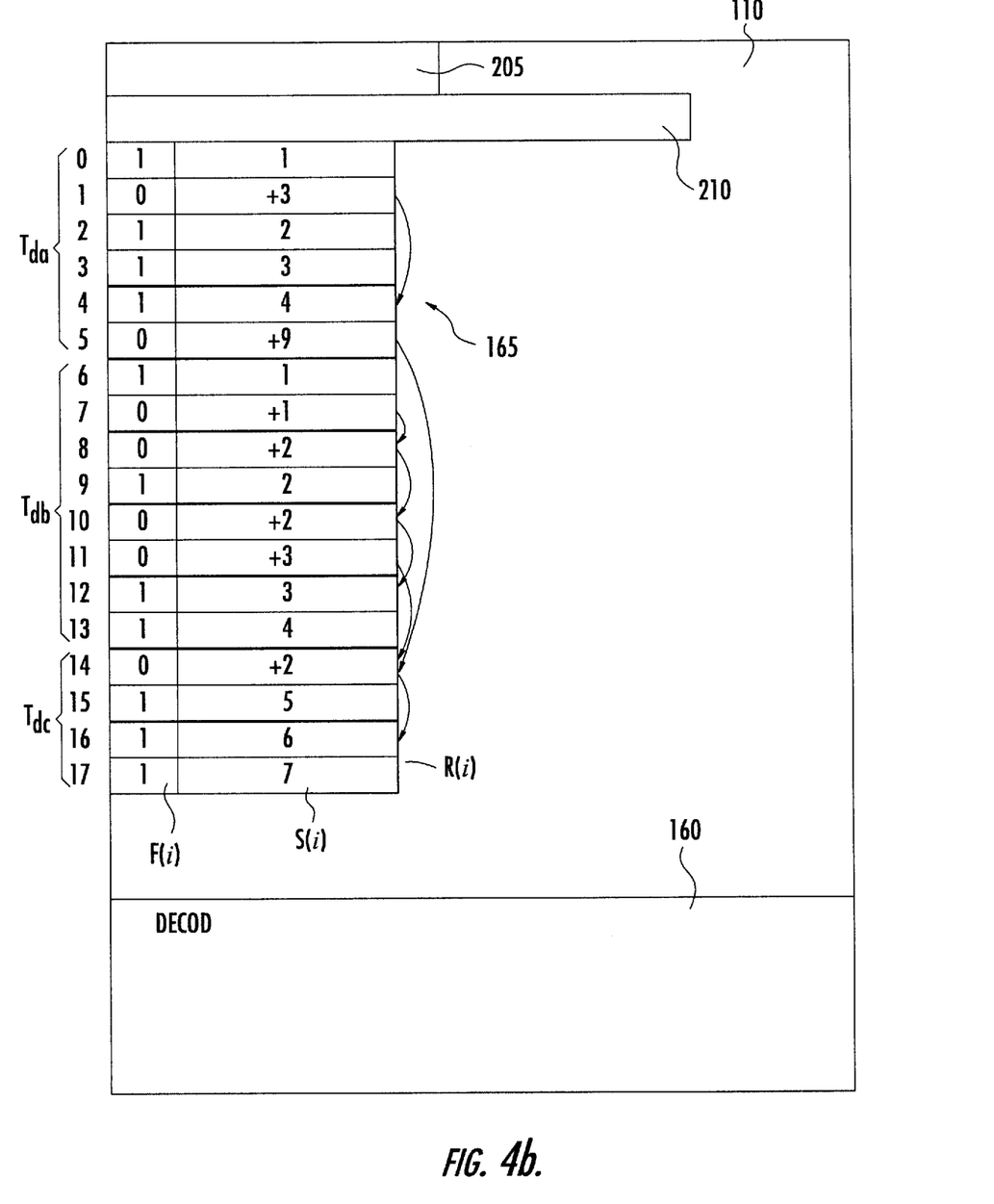

As shown in FIG. 4b, the decoding tables associated with the trees Ta and Tb are combined in a single general decoding table 165. The elements corresponding to those shown in FIG. 2b are identified by the same reference numbers or symbols, and the explanation thereof is omitted for the sake of simplicity of the description. The general decoding table 165 includes a portion Tda associated with the sub-tree which extends as far as the node Na of the tree Ta. A portion Tdb associated with the sub-tree extends as far as the node Nb of the tree Tb. A common portion Tdc associated with the sub-tree extends from the node Na of the tree Ta and with the sub-tree which extends from the node Nb of the tree Tb. In particular, the common portion Tdc comprises a plurality of adjacent rows (rows 14–17). The field S(5) of the portion Tda and field S(11) of the portion Tdb comprise a pointer at the first row of the portion Tdc (row 14).

The decoding program performs a method similar to that illustrated in FIG. 3. The sole difference comprises the fact that it is necessary to select one of the decoding tables included in the general decoding table. Basically, at the step 320 the pointer at the current node PTR is set to an initial value which is equal to the index of the first row of the decoding table selected, i.e., row 0 for the decoding table Ta, Tc and row 6 for the decoding table Tb, Tc of FIG. 4a.

This measure further allows the amount of memory occupied by the decoding tables to be further reduced and is particularly advantageous in the case where there is a very large number of decoding tables. For example, in the decoding algorithm DTS which requires about 60 decoding tables, this approach is able to achieve a further reduction in the amount of memory which is occupied, equivalent to about 15%.

Similar considerations apply in the case where there is also planned a different number of decoding tables, a different number of common portions, where each portion is common to a different number of decoding tables, and the like. The decoding method according to the present invention may also, in any case, be implemented using the decoding tables without any common portion.

The decoding method for a Huffman code described above may be subject to numerous modifications and variations carried out by a person skilled in the art, in order to satisfy contingent and specific requirements, all of which, however, are contained within the scope of protection of the invention as defined by the claims which follow.

That which is claimed is:

1. A method for decoding a Huffman code comprising:
   receiving a continuous stream of items of coded data, each item of coded data comprising a variable number of bits at least equal to a minimum number and obtaining from each item of coded data a corresponding item of source data;
   providing a decoding memory structure comprising, for each value of an initial group of bits comprising a number not greater than the minimum number and for each value of each further bit, a record formed by a flag having an end-of-decoding value or a not end-of-decoding value, and a field indicating the source data or the records associated with values of an immediately following bit depending on whether the flag has, respectively, the end-of-decoding value or the not end-of-decoding value;

accessing the record corresponding to the value of the initial group;

repeating, until a record having the flag with the end-of-decoding value is reached, accessing the record corresponding to the value of the immediately following bit by the field of a current record; and obtaining the source data from the field of the current record.

2. A method according to claim 1, wherein the initial group comprises a number of bits equal to the minimum number.

3. A method according to claim 2, wherein the minimum number is greater than one.

4. A method according to claim 1, wherein the decoding memory structure comprises a decoding table, with each record including a row of the decoding table.

5. A method according to claim 4, wherein the records associated with the values of the immediately following bit includes two adjacent rows of the decoding table, and the field indicating the records associated with the values of the immediately following bit includes a pointer at a first of the two adjacent rows.

6. A method according to claim 4, further comprising:

providing a plurality of the decoding tables; and selecting one of the decoding tables, with at least one portion of at least two of the decoding tables being common-to at least two decoding tables.

7. A method according to claim 6, wherein the decoding tables are combined in a single general decoding table comprising a plurality of adjacent rows forming the common portion, a remaining portion of each of the at least two decoding tables comprising a row with the field indicating the records associated with the values of the immediately following bit including a pointer at a first of the plurality of adjacent rows.

8. A method for decoding a Huffman code comprising:

receiving a stream of items of coded data, each item of coded data comprising a variable number of bits at least equal to a minimum number and obtaining from each item of coded data a corresponding item of source data;

storing, for each value of an initial group of bits comprising a number not greater than the minimum number and for each value of each further bit, a record formed by a flag having an end-of-decoding value or a not end-of-decoding value, and a field indicating the source data or the records associated with values of a following bit depending on whether the flag has, respectively, the end-of-decoding value or the not end-of-decoding value;

accessing the record corresponding to the value of the initial group;

repeating, until a record having the flag with the end-of-decoding value is reached, accessing the record corresponding to the value of the following bit by the field of a current record; and obtaining the source data from the field of the current record.

9. A method according to claim 8, wherein the initial group comprises a number of bits equal to the minimum number.

10. A method according to claim 9, wherein the minimum number is greater than one.

11. A method according to claim 8, wherein the decoding memory structure comprises a decoding table, with each record including a row of the decoding table.

12. A method according to claim 11, wherein the records associated with the values of the immediately following bit includes two adjacent rows of the decoding table, and the field indicating the records associated with the values of the immediately following bit includes a pointer at a first of the two adjacent rows.

13. A method according to claim 11, further comprising:

providing a plurality of the decoding tables; and selecting one of the decoding tables, with at least one portion of at least two of the decoding tables being common to at least two decoding tables.

14. A method according to claim 13, wherein the decoding tables are combined in a single general decoding table comprising a plurality of adjacent rows forming the common portion, a remaining portion of each of the at least two decoding tables comprising a row with the field indicating the records associated with the values of the immediately following bit including a pointer at a first of the plurality of adjacent rows.

15. A computer readable medium for decoding a Huffman code which can be loaded into a working memory of a processor, the computer readable medium comprising a set of instructions for:

receiving a stream of items of coded data, each item of coded data comprising a variable number of bits at least equal to a minimum number and obtaining from each item of coded data a corresponding item of source data;

storing, for each value of an initial group of bits comprising a number not greater than the minimum number and for each value of each further bit, a record formed by a flag having an end-of-decoding value or a not end-of-decoding value, and a field indicating the source data or the records associated with values of a following bit depending on whether the flag has, respectively, the end-of-decoding value or the not end-of-decoding value;

accessing the record corresponding to the value of the initial group;

repeating, until a record having the flag with the end-of-decoding value is reached, accessing the record corresponding to the value of the following bit by the field of a current record; and obtaining the source data from the field of the current record.

16. A computer readable medium according to claim 15, wherein the initial group comprises a number of bits equal to the minimum number.

17. A computer readable medium according to claim 16, wherein the minimum number is greater than one.

18. A computer readable medium according to claim 15, wherein the decoding memory structure comprises a decoding table, with each record including a row of the decoding table.

19. A computer readable medium according to claim 18, wherein the records associated with the values of the immediately following bit includes two adjacent rows of the decoding table, and the field indicating the records associated with the values of the immediately following bit includes a pointer at a first of the two adjacent rows.

20. A computer readable medium according to claim 18, further comprising instructions for:

providing a plurality of the decoding tables; and selecting one of the decoding tables, with at least one portion of at least two of the decoding tables being common to at least two decoding tables.

21. A computer readable medium according to claim 20, wherein the decoding tables are combined in a single general decoding table comprising a plurality of adjacent rows forming the common portion, a remaining portion of each of the at least two decoding tables comprising a row with the field indicating the records associated with the values of the immediately following bit including a pointer at a first of the plurality of adjacent rows.

22. A processing system for decoding a Huffman code comprising:

an input device for receiving a stream of items of coded data, each item of coded data comprising a variable number of bits at least equal to a minimum number;

a processor for obtaining from each item of coded data a corresponding item of source data;

a memory for storing a decoding memory structure comprising, for each value of an initial group of bits comprising of a number not greater than the minimum number and for each value of each further bit, a record formed by a flag having an end-of-decoding value or a not end-of-decoding value, and a field indicating the source data or the records associated with the values of a following bit depending on whether the flag has, respectively, the end-of-decoding value or the not end-of-decoding value; and said processor accessing the record corresponding to the value of the initial group, and repeating, until a record having the flag with the end-of-decoding value is reached, accessing the record corresponding to the value of the following bit by the field of the current record, and obtaining the source data from the field of the current record.

23. A processing system according to claim 22, wherein the initial group comprises a number of bits equal to the minimum number.

24. A processing system according to claim 23, wherein the minimum number is greater than one.

25. A processing system according to claim 22, wherein the decoding memory structure comprises a decoding table, with each record including a row of the decoding table.

26. A processing system according to claim 25, wherein the records associated with the values of the immediately following bit includes two adjacent rows of the decoding table, and the field indicating the records associated with the values of the immediately following bit includes a pointer at a first of-the two adjacent rows.

27. A processing system according to claim 25, wherein said processor provides a plurality of the decoding tables; and selects one of the decoding tables, with at least one portion of at least two of the decoding tables being common to at least two decoding tables.

28. A processing system according to claim 27, wherein the decoding tables are combined in a single general decoding table comprising a plurality of adjacent rows forming the common portion, a remaining portion of each of the at least two decoding tables comprising a row with the field indicating the records associated with the values of the immediately following bit including a pointer at a first of the plurality of adjacent rows.

* * * * *

UNITED STATES PATENT AND TRADEMARK OFFICE
CERTIFICATE OF CORRECTION

PATENT NO. : 6,404,358 B1  
DATED : June 11, 2002  
INVENTOR(S) : Sanguinetti

It is certified that error appears in the above-identified patent and that said Letters Patent is hereby corrected as shown below:

<u>Title page,</u>
Item [30], Foreign Application Priority Data, insert
-- June 15, 1999   (EP).........99830366.3 --
Item [75], Inventor, delete "Davide Sanguinetti, Genoa (IT)" substitute
-- Davide Sanguinetti, Sestri Levante-Genova (IT) --

Signed and Sealed this

Fifth Day of November, 2002

*Attest:*

*Attesting Officer*

JAMES E. ROGAN
*Director of the United States Patent and Trademark Office*